United States Patent
Bi et al.

(10) Patent No.: US 9,779,836 B2
(45) Date of Patent: Oct. 3, 2017

(54) METHOD FOR CONTROLLING MAGNETIC MULTI-DOMAIN STATE

(71) Applicant: Institute of Microelectronics, Chinese Academy of Sciences, Beijing (CN)

(72) Inventors: Chong Bi, Beijing (CN); Shibing Long, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 15/125,326

(22) PCT Filed: Mar. 12, 2014

(86) PCT No.: PCT/CN2014/073289
§ 371 (c)(1),
(2) Date: Sep. 12, 2016

(87) PCT Pub. No.: WO2015/135156
PCT Pub. Date: Sep. 17, 2015

(65) Prior Publication Data
US 2017/0092374 A1  Mar. 30, 2017

(51) Int. Cl.
*G11C 11/14* (2006.01)
*G11C 19/08* (2006.01)

(52) U.S. Cl.
CPC ........ *G11C 19/0858* (2013.01); *G11C 19/085* (2013.01)

(58) Field of Classification Search
CPC .................. G11C 19/0858; G11C 19/085
(Continued)

(56) References Cited

U.S. PATENT DOCUMENTS

| 2006/0118839 | A1* | 6/2006 | Sugahara | B82Y 10/00 257/295 |
| 2014/0153324 | A1* | 6/2014 | Yu | H01L 43/08 365/158 |
| 2016/0132388 | A1* | 5/2016 | Kim | G06F 3/0619 714/764 |

FOREIGN PATENT DOCUMENTS

CN          102439745 A     5/2012

OTHER PUBLICATIONS

"International Application No. PCT/CN2014/073289, International Search Report dated Dec. 2, 2014", w/ English Translation, (Dec. 2, 2014), 5 pgs.
(Continued)

*Primary Examiner* — Fernando Hidalgo
(74) *Attorney, Agent, or Firm* — Schwegman Lundberg & Woessner, P.A.

(57) ABSTRACT

The present disclosure relates to the technical field of information data storage and processing. There is provided a method for regulating magnetic multi-domain state, comprising: when a current is applied to a magnetic thin film, applying an additional external magnetic field having a magnetic field strength of 0 to 4×105 A/m to regulate magnetization state of the magnetic thin film; wherein the current is configured to drive movements of a magnetic domain of the magnetic multi-domain states in the magnetic thin film, and the external magnetic field is configured to regulate generation of new magnetic domain in the magnetic thin film and state of the magnetic domain during the movement, so that the magnetic thin film is in a stable magnetic multi-domain state. Such a multi-domain state can't be affected by a higher or lower current and keeps stable when the current is removed. Such a method may be used for magnetic memory or spin-logic device to imple-
(Continued)

ment a nonvolatile multi-valued storage, multi-bits logic operation, or neuromorphic computing.

13 Claims, 5 Drawing Sheets

(58) Field of Classification Search
USPC .. 365/171, 161, 27, 46, 55, 74, 97, 100, 31, 365/148, 158, 173, 163
See application file for complete search history.

(56) References Cited

OTHER PUBLICATIONS

"International Application No. PCT/CN2014/073289, Written Opinion dated Dec. 2, 2014", w/ English Translation, (Dec. 2, 2014), 9 pgs.

* cited by examiner

METHOD FOR CONTROLLING MAGNETIC MULTI-DOMAIN STATE

PRIORITY APPLICATIONS

This application is a U.S. National Stage Filing under 35 U.S.C. 371 from International Application No. PCT/CN2014/073289, filed on 12 Mar. 2014, and published as WO2015/135156 on 17 Sep. 2015; which application and publication are incorporated herein by reference in its entirety.

TECHNICAL FIELD

The present disclosure belongs to a technical field of storing and processing of information data, and provides a method for controlling magnetic multi-domain state of a magnetic film in a nonvolatile magnetic memory or spin logic device.

BACKGROUND

With development of information society, there is provided a higher requirement of storing and processing of information. A traditional information storage and process based on semiconductor industry approaches its physical limitation in terms of storage density and computing speed, so it becomes urgent to develop a new storage technology and information processing technology. Magnetic storage technology and spin-logic devices are paid much more attentions to due to their low power consumption and high operation speed.

In order to pursue a higher storage density, magnetic materials with strong perpendicular anisotropy and a large coercive force is widely used to a magnetic memory including a hard disk. However, a large perpendicular anisotropy and a large coercive force in turn lead to that it becomes difficult to write data based on a conventional magnetic head and a spin-transfer torque effect. Meanwhile, as another development direction of high density integration, multiple-valued storage and multi-valued logic calculation that can also be used in neuromorphic computing become very important. In the magnetic memory and spin-logic devices, since it is absent of a reliable means for magnetization operation, it is difficult for the multi-valued storage or the multi-valued logic operation which is based on the multi-domain magnetic state to be applied. Its main reason is that a process of forming magnetic domains in magnetic thin film is a random process, and the process of forming the magnetic domains is uncontrollable. Even under the same condition for forming the magnetic domains, such as introduction of defects, application of an external magnetic field or direct inletting of a large current or the like, it is difficult to get the same number of magnetic domains, the same volume of magnetic domains and the same position of the magnetic domain. From the view point of application, the magnetic film may be manufactured to be a microstructure having a characteristic dimension of several tens of nanometers to several tens of micrometers by utilizing nanofabrication technologies. However, when defects are introduced to samples having a characteristic dimension of several tens of nanometers to several tens of micrometers, currents are inlet into the samples or an external magnetic field is applied to the samples, the multi-domain states are still not able to be controlled since the uncontrollability of the magnetic domain is generally considered to be caused by a basic physical mechanism for forming the magnetic domain itself. Due to the uncontrollability of the multi-domain state, there is not yet an effective means to regulate the multi-domain state.

Therefore, it is very import to find a method for reliably regulating magnetic multi-domain states to effectively control these magnetic multi-domain stages in the application field.

SUMMARY OF THE DISCLOSURE

For the issues in which it is not easy to control magnetic multi-domain states in the magnetic storage or logic device and it is difficult to implement a write operation of storage in a high density, the present disclosure provides a method for regulating magnetic multi-domain state to achieve more precise control of the magnetic multi-domain state.

In order to achieve the above objective, the present disclosure provides a method for regulating magnetic multi-domain state, which comprises steps of: a current and an external field are simultaneously applied to a magnetic thin film to regulate magnetization state of the magnetic thin film; wherein the current is configured to drive movements of magnetic domains of the magnetic multi-domain states in the magnetic thin film, and the external magnetic field is configured to regulate generation of new magnetic domain in the magnetic thin film and state of the magnetic domain during the movement, so that the magnetic thin film is in a stable magnetic multi-domain state with a fixed ratio between two types of magnetic domains.

In the above technical solution, the magnetic multi-domain state comprises at least two magnetic domains, and the regulating magnetic multi-domain state represents simultaneously regulating two or more magnetic domains.

In the above technical solution, the current applied in the magnetic thin film is applied to the magnetic thin film in a direction parallel to the surface of the magnetic thin film or in a direction perpendicular to the surface of the magnetic thin film.

In the above technical solution, when the current is applied in the direction parallel to the surface of the magnetic thin film, the magnetic thin film is attached to a thin film layer. When the current is applied in the direction perpendicular to the surface of the magnetic thin film, the magnetic thin film is the free layer of a magnetic tunnel-junction structure or a free layer of a spin-valve structure.

In the above technical solution, the external magnetic field is implemented by growing another ferromagnetic layer or placing a permanent magnetic around the magnetic thin film, or the external magnetic field is implemented through an oersted field generated by a current in a material adjacent to the magnetic thin film or a moved magnetic head in a conventional hard disk.

In the above technical solution, an inclination angle of the direction of the external magnetic field and the direction of the current is arbitrary in a spatial scale. When the direction of the external magnetic field direction is not perpendicular to the direction of the current direction, the multi-domain state is simultaneously regulated by a polarity of the current and the external magnetic field.

In the above technical solution, when a current density of the current applied to the magnetic thin film is less than $1 \times 10^4$ A/cm$^2$, a certain hysteresis effect is happened for the external magnetic field and the regulating of the current; and when the current density is greater than $1 \times 10^4$ A/cm$^2$, the hysteresis effect disappears to determine a definite multi-domain state.

In the above technical solution, the magnetic thin film is a single ferromagnetic material, a ferromagnetic alloy, or a super lattice structure constituted of multiple layers of ferromagnetic thin film.

In the above technical solution, the magnetic domain in initial states is generated by the applied current or the magnetic domain is caused by an inherent defect of the magnetic thin film, or the magnetic domain is generated by a specific geometrical structure, or the magnetic domain is introduced by additionally applied external magnetic field.

In the above technical solution, if the magnetic domain is generated by a specific geometrical structure, the ferromagnetic layer is made to having a "T" shape to form the magnetic domain at a corner; a thickness of the ferromagnetic layer is increased at a position desired for the magnetic domain, or other ferromagnetic layer is plated at the position requiring the magnetic domain to form the magnetic domain at the position requiring the magnetic domain.

In the above technical solution, the method further comprises growing one layer of non-ferromagnetic material at one side or at both sides of the regulated magnetic thin film to improve efficiency of regulating the magnetization state. The non-ferromagnetic material is one of metal, semiconductor, or topological insulator.

As can be seen from the above technical solution, the present disclosure has the following beneficial effects:

1. By utilizing the present disclosure, the magnetic multi-domain state or the magnetic single-domain state is reliably regulated by a small external magnetic field and a current. Such a multi-domain state can't be affected by a higher or lower current and keeps stable when the current is removed.

2. By utilizing the present disclosure, the multi-domain state will no longer change with increase of the current once the multi-domain state reaches a stable state, which avoids misoperation caused by fluctuating of the current in actual application.

3. By utilizing the present disclosure, the magnetic domain formed by the current or the inherent magnetic domain formed by the defect is driven by the current so that the magnetic domain is extended to the whole magnetic sample to implement the reversion of magnetization, which solves the issue in which it is difficult for the writing operation in the storage with a high density.

4. By utilizing the present disclosure, it may be compatible with the current hard disk and magnetic random memory, which may improve the writing operation of the current magnetic storage, and may implement a multi-valued storage on the basis of the current memory to save cost.

5. By utilizing the present disclosure, it may compose a nonvolatile multi-valued magnetic dynamic random access memory (DRAM) which is better than the currently widely used DRAM in capacitance and speed.

6. By utilizing the present disclosure, it may compose a logic operator based on movements of the magnetic domain and may compose an operated magnetic domain in a Racetrack memory.

7. By utilizing the present disclosure, it may be used to control magnetization state of a magnetic memory, or a spin-logic device, or a neuromorphic computing device, so as to implement a nonvolatile multi-valued storage and a multi-bit logic operation.

BRIEF DESCRIPTION OF THE DRAWINGS

FIG. 3A-3D show regulating results of a Co/Ni/Co sample when an external magnetic field is perpendicular to the surface of the thin film.

FIG. 4A-4B show regulating results of samples Pt/Co/AlOx when the external magnetic field is parallel to the direction of the current; in which

DETAILED DESCRIPTION

In order to make the objectives, technical solutions, and advantages of the present disclosure be apparent, the present disclosure will be further illustrated in detail in conjunction with particular embodiments and with reference to the accompany figures.

A basic idea of the method for regulating magnetic multi-domain state according to the present disclosure is to utilize a spin-polarized current passing through a ferromagnetic layer to generate a magnetic domain or to drive the magnetic domain to move, and to regulate relative velocity of domain walls of the magnetic domain at both sides by regulating direction and size of an external magnetic field and the polarity of the current. During the movement, the magnetic domain is expanded or compressed to control the multi-domain states in the whole magnetic thin film to precisely control the magnetic multi-domain state. The present disclosure not only solves uncontrollability of magnetization strength in magnetic multi-valued storage and multi-bit logic operation, but also provides an effective means for writing operation in the current magnetic memory.

On the basis of the basic idea as mentioned above, the present disclosure provides a method for regulating magnetic multi-domain state, which comprises steps of: when a current is applied to a magnetic thin film, applying an external magnetic field having a magnetic field strength of 0 to $4\times10^5$ A/m to regulate magnetization state of the magnetic thin film; wherein the current is configured to drive movements of a magnetic domain in the magnetic thin film, and the external magnetic field is configured to regulate generation of the magnetic domain in the magnetic thin film and state of the magnetic domain during the movement, so that the magnetic thin film is in a stable magnetic multi-domain state. The magnetic thin film may be a single ferromagnetic material, a ferromagnetic alloy, or a super lattice structure constituted of multiple layers of ferromagnetic thin film.

Figure 1:
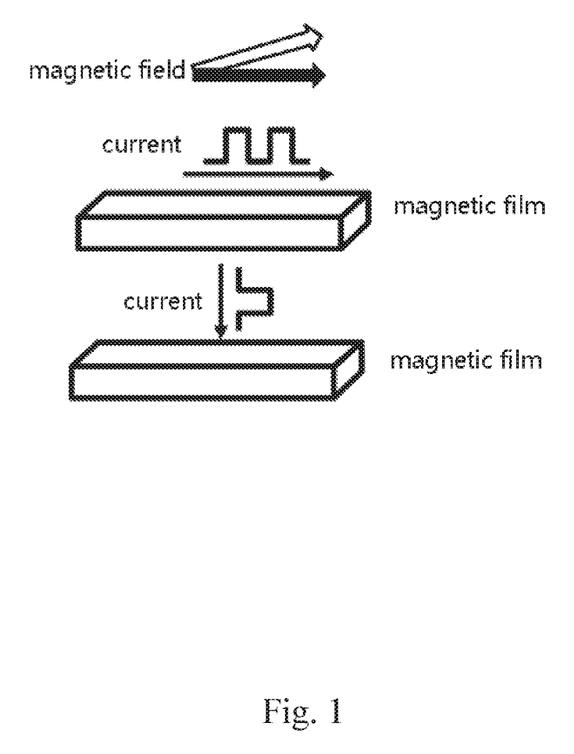
FIG. 1 is a schematic diagram of two typical cases in which the magnetic multi-domain state is regulated on the basis of the current and the external magnetic field.

As shown in FIG. 1, FIG. 1 is a schematic diagram of two typical cases in which the magnetic multi-domain state is regulated on the basis of the current and the external magnetic field according to the present disclosure. The magnetic field may be along arbitrary direction, and the current may be applied within a surface of the thin film and may be applied perpendicular to the surface of the thin film.

Among others, the current applied in the magnetic thin film is applied to the magnetic thin film in a direction parallel to the surface of the magnetic thin film or in a direction perpendicular to the surface of the magnetic thin film. When the current is applied in the direction parallel to the surface of the magnetic thin film, the magnetic thin film is attached to a thin film layer. When the current is applied in the direction perpendicular to the surface of the magnetic thin film, the magnetic thin film is a free-reversion layer in a magnetic tunnel-junction configuration or a free-reversion layer in a spin-valve configuration.

The external magnetic field is implemented by growing a ferromagnetic layer or placing a permanent magnetic around the magnetic thin film, or the external magnetic field is implemented through an oersted field generated by a current in a material adjacent to the magnetic thin film or a moved magnetic head in a conventional hard disk. An inclination angle of the direction of the external magnetic field and the direction of the current is arbitrary in a spatial scale. When the direction of the external magnetic field direction is not perpendicular to the direction of the current direction, the multi-domain state is simultaneously regulated by a polarity of the current and the external magnetic field.

Furthermore, when a current density of the current applied to the magnetic thin film is less than $1 \times 10^4$ A/cm$^2$, a certain hysteresis effect is happened for the external magnetic field and the regulating of the current; and when the current density is greater than $1 \times 10^4$ A/cm$^2$, the hysteresis effect disappears to determine a definite multi-domain state.

When the state of the magnetic domain is controlled by the current, the magnetic domain is generated by the applied current or the magnetic domain is caused by an inherent defect of the magnetic thin film, or the magnetic domain is generated by a specific geometrical structure, or the magnetic domain is introduced by additionally applied external magnetic field. If the magnetic domain is generated by a specific geometrical structure, the ferromagnetic layer is made to having a "T" shape to form the magnetic domain at a corner; a thickness of the ferromagnetic layer is increased at a position desired for the magnetic domain, or other ferromagnetic layer is plated at the position requiring the magnetic domain to form the magnetic domain at the position requiring the magnetic domain.

The method for regulating magnetic multi-domain state according to the present disclosure further comprises growing one layer of non-ferromagnetic material at one side or at both sides of the regulated magnetic thin film to improve efficiency of regulating the magnetization state. The non-ferromagnetic material is one of metal, semiconductor, or topological insulator.

Figure 2:
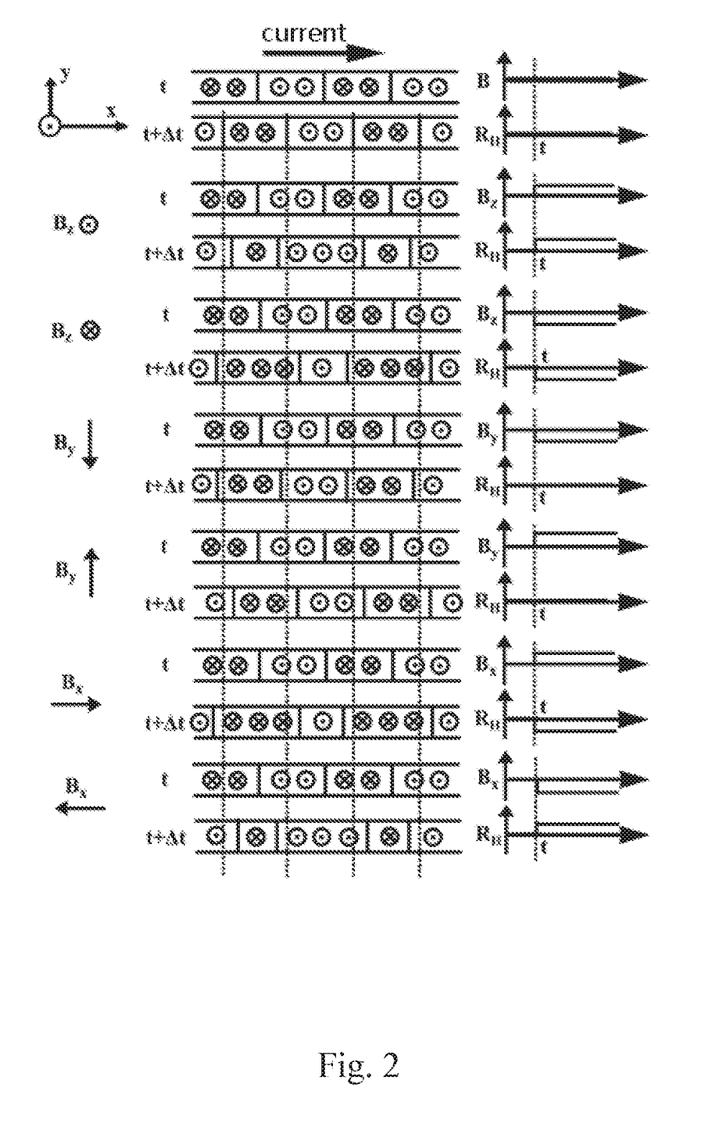
FIG. 2 is a schematic view of the principle for regulating the magnetic multi-domain state on the basis of the current and the external magnetic field according to the present disclosure.

In FIG. 1, when the current passes within the surface of the magnetic film, the spin-polarized current may be implemented by passing the current through the magnetic thin film itself, and may be implemented by the spin-polarized current caused by a spin-hall effect in the adjacent metal layer. When the current passes in a direction perpendicular to the surface of the magnetic thin film, the polarized current may be implemented by a spin filtering effect of the magnetic tunnel junction or pinned ferromagnetic layer in the spin-valve configuration. Since the formation and movement of the magnetic domain may be affected by the adjacent layers, the regulating efficiency may be distinctly improved by changing components of the adjacent layers. For example, the adjacent layers is formed of Pt, TA or W. When the direction of the magnetic field and the direction of the current is not co-linear, the effect of regulating the multi-domain by the polarity of the current is weak; on the contrary, the effect is remarkable. FIG. 2 is a schematic view of the principle for regulating the magnetic multi-domain state in one-dimensional nanowire configuration.

FIG. 2 is a schematic view of the principle for regulating the magnetic multi-domain state on the basis of the current and the external magnetic field according to the present disclosure. The current is along +x direction, and the external magnetic field is applied along x, y and z directions, respectively. It shows a time relationship between the external magnetic field and measured $R_H$ (which is in proportion to a total magnetic torque after offsetting of the magnetic domain along the upward and downward directions) at right side of FIG. 2. Prior to a moment t, any magnetic field is applied, and the magnetic domain along the upward direction (indicated by dot) and the magnetic domain along the downward direction (indicated by cross) are about 50%, respectively, and these magnetic domains are driven by the current and moved in a high speed along the direction of the current. When the magnetic field is applied, walls at both sides of the magnetic domain move at different speeds, so that the magnetic domain along a certain direction is expanded or compressed.

In practice, the current can be supplied through a peripheral power supply circuit. The external magnetic field may be implemented by an Oster field in the neighboring wires, or may be implemented by placing a small permanent magnet at the whole sample or growing a layer of thin film of the permanent magnet at a specific position.

The regulating result of the present disclosure will be approved by taking a Co/Ni/Co sample and a super-thin Co sample an example. The present disclosure manufactures a sample of Pt 1.5/Co 0.3/Ni 0.6/Co 0.3/Pt 1.5 (nm) and a sample of Pt 2.5/Co 0.6/AlOx 1.5 (nm) by magnetron sputtering and configures the manufactured samples into a structure for hall measurement with a width of 2.5 micrometer by means of micromaching.

Figure 3A:
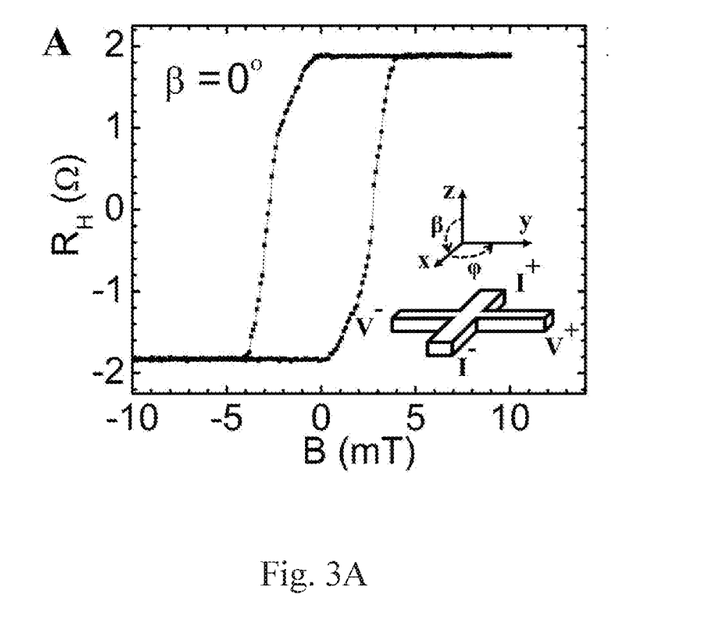
FIG. 3A shows a relationship between $R_H$ and the external magnetic field when the magnetic field is along z axis, and an inset shows a schematic view of measurement.
Figure 3B:
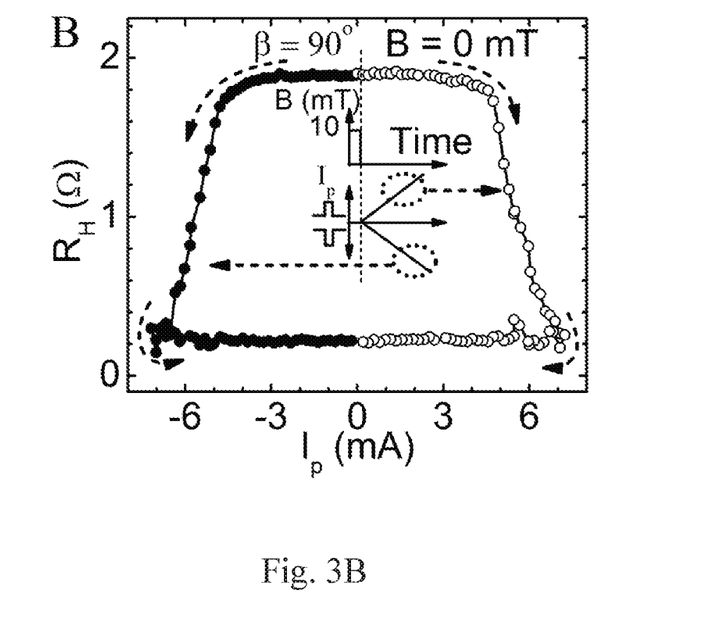
FIG. 3B shows a relationship between $R_H$ and amplitude of the current pulse in which the magnetization state is set to be along +z direction by the external magnetic field and the current pulse is increased and then decreased, and an inset shows a schematic view of the external magnetic field and the current pulse.
Figure 3C:
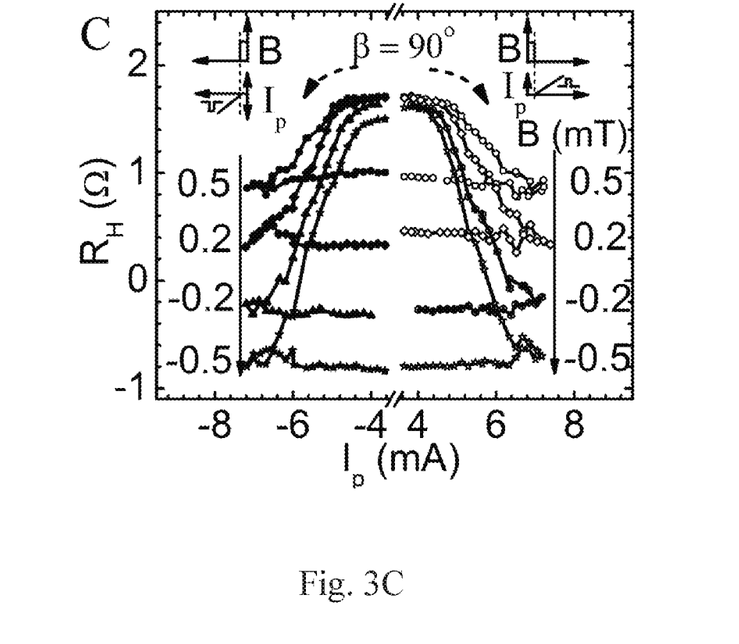
FIG. 3C and FIG. 3D show a relationship between $R_H$ and the amplitude of the current pulse with the external magnetic field, in which the magnetization state is set to be along +z direction (FIG. 3C) and −z direction (FIG. 3D)
Figure 3D:
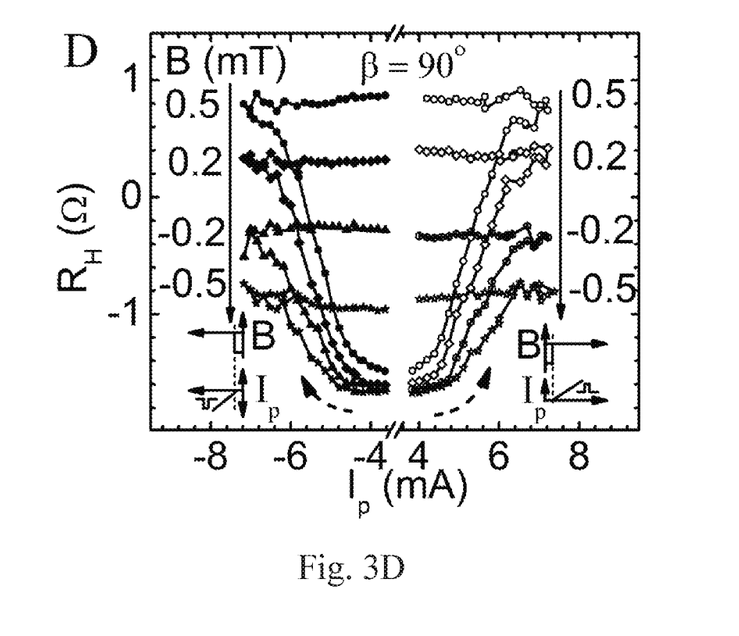

FIG. 3A-3D show regulating results of a Co/Ni/Co sample when an external magnetic field is perpendicular to the surface of the thin film, in which FIG. 3A shows a relationship between $R_H$ and the external magnetic field when the magnetic field is along z axis, and an inset shows a schematic view of measurement; FIG. 3B shows a relationship between $R_H$ and amplitude of the current pulse in which the magnetization state is set to be along +z direction by the external magnetic field and the current pulse is increased and then decreased, and an inset shows time sequences of the external magnetic field and the current pulse; FIG. 3C and FIG. 3D show a relationship between $R_H$ and the amplitude of the current pulse with the external magnetic field, in which the magnetization state is set to be along +z direction (FIG. 3C) and −z direction (FIG. 3D).

The inset of FIG. 3A shows a schematic view of the sample and circuits for regulating the magnetic multi-domain states. I$^+$ and I$^-$ represent directions of the applied current, and V$^+$ and V$^-$ represent that an external voltmeter is connected detect the magnetic multi-domain stages after being regulated. The whole sample is fixed to a sample table which may be rotated in arbitrary directions, and then is positioned under a continuously adjustable external magnetic field having a magnetic field strength of 0-5000 oersted (os). The external magnetic field is generated by an electromagnet. A regulating process is shown as follows: 1) firstly, the sample table is rotated to apply the magnetic field to the sample along z direction. 2) A current pulse having duration of 20 μs is applied, and then a constant current having amplitude of 50 μA is applied. While the current having amplitude of 50 μA is applied, the external voltmeter is connected to detect voltages at V⁺ and V⁻, and the magnetization states of the magnetic thin film is determined according to the voltage. 3) The magnetic field is increased from 0 Oe to 5000 Oe at a step of 1 Oe, and the step of 2) is repeated at each of the magnetic field; and the relationship of the magnetization states and the external magnetic field after the current is applied is recorded. 4) The sample table is rotated so that the magnetic field may be along arbitrary directions such as x direction and y direction; the step of 3) is repeated and regulating results at different directions of the magnetic field are recorded. 5) The amplitude of the current pulse is changed, and the step of 4) is repeated to measure the regulating results at different current intensities.

It is firstly confirmed by FIG. 3A that the manufactured sample has a vertical anisotropy and it is measured by an anomalous hall effect in which a constant current having amplitude of 50 μA is applied, a voltage difference between V⁺ and V⁻ is measured, and a ratio $R_H$ of the voltage difference to the value of the current having amplitude of 50 μA is calculated. The value of $R_H$ reflects a size of the magnetization strength along the z direction. A positive maximum value represents a single-domain state in which all of the magnetic torque direct to the +z direction, a negative maximum value represents a single-domain state in which all of the magnetic torque direct to the −z direction, and other values represent that the magnetization state is at different multi-domain state. FIG. 3B shows a relationship between $R_H$ and amplitude of the current pulse measured by gradually increasing amplitude of the applicant current pulse without any magnetic field. Before the measurement, the magnetization strength is set to be the single domain state along the +z direction by applying a magnetic field of 10 mT along the positive direction. The inset of FIG. 3B shows time sequences of the external magnetic field and amplitude of the current pulse. As can be seen from it, $R_H$ gradually decreases when the current is increased until the current becomes 0 in a balance state. The balance state will not be changed whether the current is increased or decreased. As can be seen from FIG. 3B, when the applied current is in a negative direction, $R_H$ finally is balanced around 0, which means that the final state is irrespective of the direction of the current. FIG. 3B indicates that when a large current is applied, the magnetization strength becomes a stable multi-domain state from an initial single-domain state and the numbers of the multi-domain states in the upward and downward directions are identical to each other.

FIG. 3C and FIG. 3D show measuring results when a magnetic field perpendicular to the surface of the film is applied during the measurement, in which FIG. 3C shows an initial magnetization state is a single-domain state along the +z direction, and FIG. 3D shows an initial magnetization state is a single-domain state along the −z direction. As can be seen from FIG. 3C and FIG. 3D, the externally applied minute magnetic field may change the final balanced magnetization state. That is to say, the ratio 1:1 of the upper magnetic domain to the lower magnetic domain without magnetic fields may be regulated to be any ratio according to the value and direction of the magnetic field. FIG. 3C and FIG. 3D have two distinct features: 1) in the final balanced magnetization state caused by the minute magnetic field, the ratio of the upper magnetic domain to the lower magnetic domain cannot be changed by larger or smaller current, which indicates that the final balanced state only relates to the applied external magnetic field; and 2) the positive and negative currents lead to the same final balanced state, i.e. the final balanced state is irrespective of the polarity of the current.

Figure 4A:
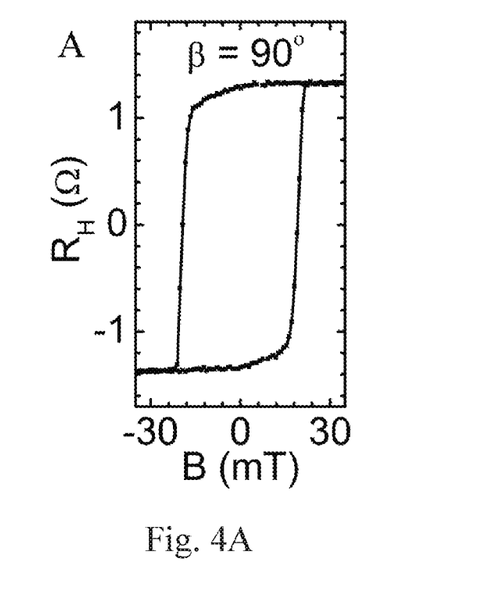
FIG. 4A shows a relationship between $R_H$ and the external magnetic field when the magnetic field is along the z axis.
Figure 4B:
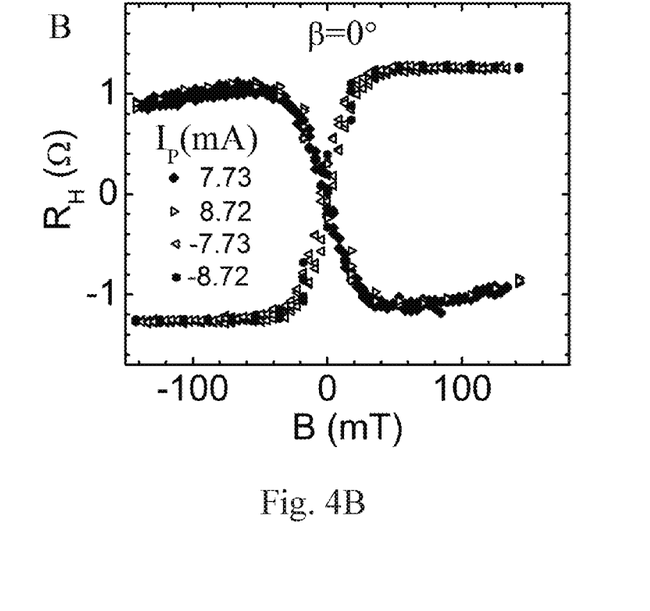
FIG. 4B shows a relationship between $R_H$ and the external magnetic field under different current pulses of 7.74 mA and 8.72 mA.

FIG. 3A-3D show regulating results of a Co/Ni/Co sample when an external magnetic field is perpendicular to the surface of the thin film. For a Pt/Co/AlOx sample, the present disclosure may get the same result. When the external magnetic field is not perpendicular to that of the current, the final magnetization state relates to the polarity of the current except for relating to the size and direction of the external magnetic field. In the following, the present disclosure will illustrate a measuring result when the external magnetic and the current is co-linear in a specific situation in which the external magnetic field is not perpendicular to that of the current. In such a situation, the results for the Co/Ni/Co and the Pt/Co/AlOx samples are still identical. The present disclosure only illustrates the measuring result of the Pt/Co/AlOx sample, as shown in FIG. 4B. When the external magnetic field is co-linear with the current, the measurement is identical to those of FIG. 3A-FIG. 3D. However, FIG. 4B shows a relationship between the final balanced states and the external magnetic field under different current pulses of 7.74 mA and 8.72 mA. FIG. 4A shows a relationship between the measured $R_H$ and the external magnetic field when the magnetic field is perpendicular to that of the current to determine the multi-domain stages under different magnetic field as shown in FIG. 4B. FIG. 4B indicates that: 1) in the same external magnetic field, the polarity of the current may change the final state of the magnetization strength and the positive and negative current leads to that the ratio of the upward and downward magnetic domains are opposite; 2) when the external magnetic field is small, the current will not lead to completely disappearing of the magnetic domain along a certain direction, i.e. it may only change the ratio of the upward magnetic domain to the downward magnetic domain; and when the external magnetic field is large, the positive and negative current leads to completely disappearing of the magnetic domain along the upward or downward direction and there appears a phenomenon in which the magnetization state is reversed from the upward single domain to the downward single domain; 3) the final stable magnetic domain state still does not relate to the size of the externally applied current, as shown in the figure, and the currents of 7.74 mA and 8.72 Ma lead to the same multi-domain states; and the balanced multi-domain states will not be affected by the lower current and remains to be stable after the current is removed.

As can be seen from the above experiment results, such a means for regulating the multi-domain state is reliable and stable and will not be affected by fluctuation of the current. Such a means may be applied to construct a nonvolatile multi-states magnetic random memory, dynamic random memory, multi-states logic operator and so on, and may be applied to write data information in a high density disk.

The particular embodiments as mentioned above further illustrate the objectives, technical solutions and advantages of the present disclosure. It should be understood that the above description is only the specific embodiment of the present disclosure but is not to limit the disclosure. Any modifications, equivalent substitutions and improvements should be included within the scope of the present disclosure within spirit and principle of the present disclosure.

We claim:

1. A method for regulating magnetic multi-domain state, comprising:
    providing a ferromagnetic thin film;

applying a current and an external magnetic field simultaneously to manipulate the magnetization state of the ferromagnetic thin film to a stable multi-domain state with a desired ratio between two types of magnetic domains with opposite magnetization directions; wherein the current is configured to drive movements of magnetic domains in the magnetic thin film, and the external magnetic field is configured to regulate generation/annihilation of magnetic domains in the magnetic thin film and state of the magnetic domain during the movement, so that the magnetic thin film is manipulated to a stable magnetic multi-domain state.

2. The method according to claim 1, wherein the ferromagnetic thin film is an isolated ferromagnetic layer or a component of a magnetic structure: the magnetic field strength is in the range of 0 to $4 \times 10^5$ A/m; the magnetization directions of the two types of domains are opposite; the magnetic multi-domain state comprises at least two magnetic domains; the regulating magnetic multi-domain state represents simultaneously regulating two or more magnetic domains; and the stable magnetic multi-domain state means that the ratio between the two types of magnetic domains keeps constant.

3. The method according to claim 1, wherein the current is applied to the magnetic thin film in a direction parallel to the surface of the magnetic thin film or in a direction perpendicular to the surface of the magnetic thin film.

4. The method according to claim 3, wherein when the current is applied in the direction perpendicular to the surface of the ferromagnetic thin film, the ferromagnetic thin film is the free layer of a magnetic tunnel-junction structure or the free layer of a spin-valve structure.

5. The method according to claim 1, wherein the external magnetic field is implemented by growing another ferromagnetic layer or placing a permanent magnet around the magnetic thin film, or the external magnetic field is implemented through an oersted field generated by a current in a material adjacent to the magnetic thin film or a moved magnetic head in a conventional hard disk.

6. The method according to claim 1, wherein an inclination angle of the direction of the external magnetic field and the direction of the current is arbitrary in a spatial scale.

7. The method according to claim 5, wherein when the direction of the external magnetic field direction is not perpendicular to the direction of the current direction, the multi-domain state is simultaneously regulated by the polarity of the applied current and the direction of the external magnetic field.

8. The method according to claim 1, wherein the ferromagnetic thin film is a pure ferromagnetic material, a ferromagnetic alloy, a ferromagnetic semiconductor, or a ferromagnetic multilayer.

9. The method according to claim 1, wherein the initial magnetization state before applying the current and external field is a uniformly magnetized state or a multi-domain state; the magnetic domain in the multi-domain initial state is generated by another current or is caused by an inherent defect of the magnetic thin film, or is generated by a specific geometrical structure, or is introduced by additionally applied external magnetic field.

10. The method according to claim 1, wherein if the magnetic domain in a multi-domain initial state is generated by a specific geometrical structure, the ferromagnetic thin film is made to having a "T" shape to form the magnetic domain at a corner, the thickness of the ferromagnetic thin film is increased at a position desired for the magnetic domain, or other ferromagnetic layer is plated near the ferromagnetic thin film.

11. The method according to claim 1, further comprising growing one non-ferromagnetic layer at one side or at both sides of the ferromagnetic thin film to improve efficiency of regulating the magnetization state.

12. The method according to claim 10, wherein the non-ferromagnetic layer is metal, semiconductor, or topological insulator.

13. The method according to claim 1, wherein the current density is greater than $1 \times 10^4$ A/cm2, under which the ratio between two types of magnetic domains becomes deterministic at a fixed external field.

* * * * *